США008654166B2

United States Patent
Kamatani

(10) Patent No.: US 8,654,166 B2
(45) Date of Patent: Feb. 18, 2014

(54) RECEIVING DEVICE, DRIVING UNIT, AND IMAGE FORMING APPARATUS

(75) Inventor: Tomohiko Kamatani, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 956 days.

(21) Appl. No.: 12/704,131

(22) Filed: Feb. 11, 2010

(65) Prior Publication Data

US 2010/0231988 A1    Sep. 16, 2010

(30) Foreign Application Priority Data

Mar. 12, 2009  (JP) .................. 2009-060256

(51) Int. Cl.
*B41J 2/435*  (2006.01)
*B41J 2/47*  (2006.01)

(52) U.S. Cl.
USPC .......................................... 347/237; 347/247

(58) Field of Classification Search
USPC .............. 347/236, 237, 246, 247; 327/58–60, 327/62–67, 72, 90, 89, 96
See application file for complete search history.

(56) References Cited

U.S. PATENT DOCUMENTS

| 7,944,246 B2 * | 5/2011 | Uchiki ............................ 327/58 |
| 2009/0206806 A1 | 8/2009 | Kamatani | |

FOREIGN PATENT DOCUMENTS

| JP | 4-37231 | 2/1992 | |
| JP | 2005-33571 | 2/2005 | |
| JP | 3798571 | 4/2006 | |
| JP | 2007-60569 | 3/2007 | |
| JP | 2007060569 A | * 3/2007 | ............... H04N 1/00 |
| JP | 2007-95907 | 4/2007 | |
| JP | 3958157 | 5/2007 | |
| JP | 2007-221600 | 8/2007 | |
| JP | 2009-194599 | 8/2009 | |

OTHER PUBLICATIONS

Japanese official action dated Feb. 19, 2013 in corresponding Japanese patent application No. 2009-060256.

* cited by examiner

*Primary Examiner* — Hai C Pham
(74) *Attorney, Agent, or Firm* — Cooper & Dunham LLP

(57) ABSTRACT

Disclosed is a receiving device that includes a differential input circuit having an inverting input terminal and a non-inverting input terminal to which the differential signal is input; an abnormality detection circuit that detects an abnormality in a wiring connected to the inverting input terminal and the non-inverting input terminal; and a control circuit that sets an output signal of the receiving device in a predetermined status when the abnormality is detected. The abnormality detection circuit detects the abnormality if a status, in which a potential difference between a voltage of the inverting input terminal and a voltage of the non-inverting input terminal is less than a minimum potential difference in a predetermined range of the potential difference between the voltage of the inverting input terminal and the voltage of the non-inverting input terminal, continues for a predetermined time or more.

12 Claims, 8 Drawing Sheets

RECEIVING DEVICE, DRIVING UNIT, AND IMAGE FORMING APPARATUS

BACKGROUND OF THE INVENTION

1. Field of the Invention

The present invention relates to a receiving device that receives a signal transmitted from a driver that transmits a small-amplitude differential signal, a driving unit having the receiving device, and an image forming apparatus having the driving unit.

2. Description of the Related Art

In recent years and continuing to the present, attention has been paid to a LVDS (Low Voltage Differential Signal) method as a data transmission method for fulfilling demands for high-speed data. The LVDS method is used in PPCs (Plain Paper Copiers) or laser printers, for example, when an image processing processor transmits data to a laser driver that drives laser diodes.

A general LVDS method is implemented in such a manner that a LVDS driver and a LVDS receiver are connected to each other via a connection cable. If input data of the input terminal of the LVDS receiver become indefinite in the general LVDS method, output data of the LVDS receiver also become indefinite.

If output data of the LVDS receiver become indefinite when the LVDS method is used for transmitting data between the image processing processor and the laser driver described above, there arise problems, for example, in controlling the light emission of the laser diodes.

In order to deal with such problems, known LVDS receivers are configured to detect the indefinite status of input data applied to an input terminal. FIGS. 1A and 1B are diagrams showing examples of the known LVDS receivers, and FIG. 2 is a diagram showing another example of the known LVDS receiver.

For example, if input terminals A and B are broken in the LVDS receivers shown in FIGS. 1A and 1B, pull-up resistors Rp make the voltages of wiring connected to the input terminals A and B close to a power supply voltage. At this time, the LVDS receivers shown in FIGS. 1A and 1B detect the broken statuses of the input terminals A and B. The LVDS receiver shown in FIG. 2 operates in the same manner as the LVDS receivers shown in FIGS. 1A and 1B.

Besides the LVDS receivers shown in FIGS. 1A, 1B, and 2, Patent Document 1 discloses a technology that transmits data using a low voltage differential signal and prevents, based on the data, an accident caused when laser beams are emitted.

With the above technology, however, an abnormality in a signal line cannot be detected if only one of the two input terminals (inverting input terminal and non-inverting input terminal) is broken. This is because both of the voltage of the inverting input terminal and that of the non-inverting input terminal of the LVDS receiver have the same potential due to a terminating resistor when only one of the input terminals is broken.

This phenomenon occurs with a reference voltage that determines an in-phase input voltage of the LVDS receiver because the resistance of the pull-up resistor is generally significantly greater than the terminating resistor.

Furthermore, in a case where wiring on the side of one of the input terminals is short-circuited (ground or power supply voltage), the voltage of the inverting input terminal and that of the non-inverting input terminal of the LVDS receiver may also have the same potential at an unintended voltage level (ground or power supply voltage). Accordingly, the abnormality in the signal line cannot be detected. Moreover, in a case where the inverting input terminal and the non-inverting input terminal are short-circuited, the voltage of the inverting input terminal and that of the non-inverting input terminal may also have the same potential. Accordingly, the abnormality in the signal line cannot be detected.

Furthermore, in the known LVDS receiver, a reference voltage that determines an in-phase input voltage of the LVDS receiver and output data on the side of the LVDS driver may be separately controlled. In this case, if an output on the side of the LVDS driver shows high impedance and the reference voltage is normally output, the voltages of the two input terminals of the LVDS receiver have the same potential. Accordingly, the abnormality in the signal line cannot be detected.

If the voltage of the inverting input terminal and that of the non-inverting input terminal have the same potential, output data of the LVDS receiver become indefinite.

If output data become indefinite, data cannot be properly transmitted from the LVDS receiver to a laser driver. In case that a load driven by the data transmitted from the LVDS receiver may have an affect on the human body as in the case of laser diodes, the abnormality in the signal line must be particularly detected to stop an output as soon as possible.

Furthermore, the LVDS driver and the LVDS receiver may have a different power supply, and the power supply of the LVDS driver and the withstand voltage of output transistors included in the LVDS driver may be small. If an output of the LVDS driver shows high impedance in this case, the power supply of the LVDS is directly applied to the LVDS driver, which may result in the LVDS driver being broken.

Patent Document 1: JP-B2-3798571

SUMMARY OF THE INVENTION

The present invention has been made in view of the above circumstances and may provide a receiving device capable of detecting an abnormality in a signal line in a LVDS receiver, a driving unit, and an image forming apparatus.

According to a first aspect of the present invention, there is provided a receiving device that receives a signal transmitted from a driver that transmits a small-amplitude differential signal. The receiving device includes a differential input circuit having an inverting input terminal and a non-inverting input terminal to which the differential signal is input; an abnormality detection circuit that detects an abnormality in a wiring connected to the inverting input terminal and the non-inverting input terminal; and a control circuit that sets an output signal of the receiving device in a predetermined status when the abnormality is detected. The abnormality detection circuit detects the abnormality if a status, in which a potential difference between a voltage of the inverting input terminal and a voltage of the non-inverting input terminal is less than a minimum potential difference in a predetermined range of the potential difference between the voltage of the inverting input terminal and the voltage of the non-inverting input terminal, continues for a predetermined time or more.

According to a second aspect of the present invention, there is provided a driving unit that drives a load based on an output signal from a receiving device that receives and outputs a small-amplitude differential signal transmitted from a driver. The receiving device includes a differential input circuit having an inverting input terminal and a non-inverting input terminal to which the differential signal is input; an abnormality detection circuit that detects an abnormality in a wiring connected to the inverting input terminal and the non-inverting input terminal; and a control circuit that sets an output signal of the receiving device in a predetermined status to stop a driving of the load when the abnormality is detected. The abnormality detection circuit detects the abnormality if a status, in which a potential difference between a voltage of the inverting input terminal and a voltage of the non-inverting input terminal is less than a minimum potential difference in a predetermined range of the potential difference between the voltage of the inverting input terminal and the voltage of the non-inverting input terminal, continues for a predetermined time or more.

According to a third aspect of the present invention, there is provided an image forming apparatus that irradiates a charged front surface of a photosensitive body with a laser beam of a laser diode to form an electrostatic latent image and fixes toner attached to the electrostatic latent image onto a recording medium to perform image formation. Te image forming apparatus includes a driving unit that controls a light emission of the laser diode. The driving unit causes the laser diode to emit light based on an output signal from a receiving device that receives and outputs a small-amplitude differential signal transmitted from a driver. The receiving device includes a differential input circuit having an inverting input terminal and a non-inverting input terminal to which the differential signal is input; an abnormality detection circuit that detects an abnormality in a wiring connected to the inverting input terminal and the non-inverting input terminal; and a control circuit that sets an output signal of the receiving device in a predetermined status to stop the light emission of the laser diode when the abnormality is detected. The abnormality detection circuit detects the abnormality if a status, in which a potential difference between a voltage of the inverting input terminal and a voltage of the non-inverting input terminal is less than a minimum potential difference in a predetermined range of the potential difference between the voltage of the inverting input terminal and the voltage of the non-inverting input terminal, continues for a predetermined time or more.

According to embodiments of the present invention, an abnormality in a signal line in a LVDS receiver can be detected.

Other objects, features and advantages of the present invention will become more apparent from the following detailed description when read in conjunction with the accompanying drawings.

DETAILED DESCRIPTION OF THE PREFERRED EMBODIMENTS

According to embodiments of the present invention, an abnormality in a signal line is detected when a status, in which a potential difference between a voltage of an inverting input terminal and that of a non-inverting input terminal of a LVDS receiver is less than a minimum potential difference in the range of the potential difference where the LVDS receiver can normally transmit data, continues for a predetermined time.

First Embodiment

Figure 1A:
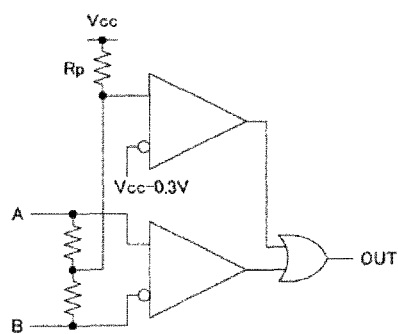
FIGS. 1A and 1B are diagrams showing examples of known LVDS receivers.
Figure 1B:
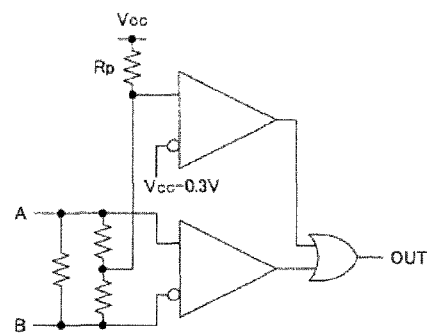
Figure 2:
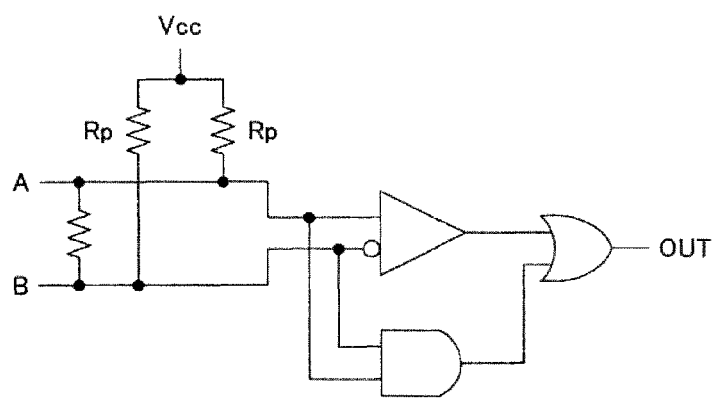
FIG. 2 is a diagram showing another example of the known LVDS receiver.
Figure 3:
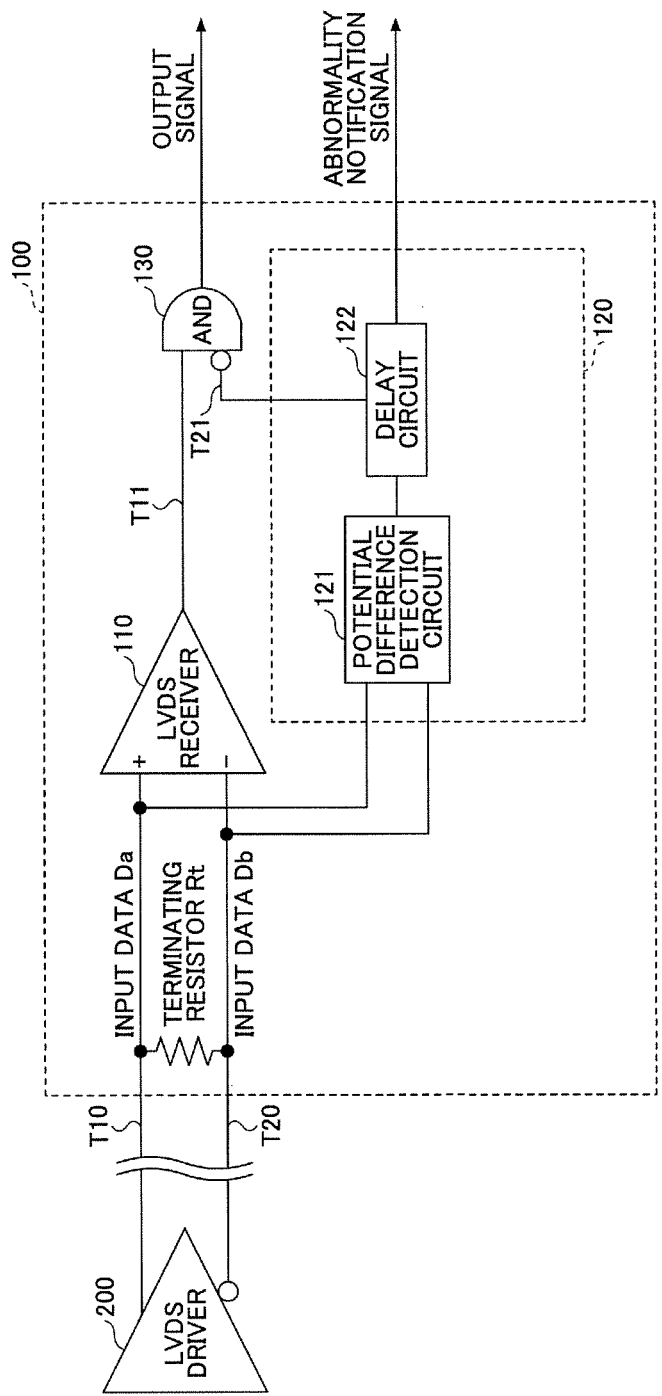
FIG. 3 is a diagram for illustrating a receiving device 100 of a first embodiment.

Referring now to FIG. 3, a first embodiment of the present invention is described below. FIG. 3 is a diagram for illustrating a receiving device 100 of the first embodiment.

The receiving device 100 of this embodiment has a LVDS receiver 110, an abnormality detection circuit 120, an AND circuit 130, and a terminating resistor Rt.

The LVDS receiver 110 is a differential input circuit having two differential input terminals T10 and T20 and is connected to a LVDS driver 200 via a connection cable (not shown). The LVDS receiver 110 outputs logical signals corresponding to differential voltage signals (hereinafter referred to as input data) Da and Db supplied between the differential input terminals T10 and T20. Note that the input data Db are signals having a phase opposite to those of the input data Da. The terminating resistor Rt is connected between the differential input terminals T10 and T20.

The abnormality detection circuit 120 detects an abnormality in a signal line based on the input data Da and Db input to the LVDS receiver 110. The abnormality detection circuit 120 of this embodiment has a potential difference detection circuit 121 and a delay circuit 122.

The potential difference detection circuit 121 has an input connected to the non-inverting input terminal T10 and the inverting input terminal T20 of the LVDS receiver 110 and detects a potential difference between a voltage of the non-inverting input terminal T10 and that of the inverting input terminal T20 (hereinafter referred to as an input potential difference). If the input potential difference becomes less than a predetermined value, the potential difference detection circuit 121 outputs a signal indicating that the input potential difference is less than a standard minimum potential difference to the delay circuit 122. The potential difference detection circuit 121 of this embodiment is configured to output a high-level (hereinafter referred to as a H-level) signal if the input potential difference is less than the standard minimum potential difference.

Note that the standard minimum potential difference is a minimum potential difference in the range of the input potential difference where the LVDS receiver 110 can normally transmit data, indicating the value specified in advance based on the standard corresponding to the specifications of the LVDS receiver 110.

If the H-level signal from the potential difference detection circuit 121 is continuously input for a predetermined delay time, the delay circuit 122 outputs the H-level signal to the AND circuit 130. Note that in this embodiment, a total time of the delay time set in the delay circuit 122 and a potential-difference detection delay time by the potential difference detection circuit 121 is preferably twice or more as large as a minimum operating transfer rate of the LVDS receiver 110.

When the abnormality in the signal line is detected by the abnormality detection circuit 120, the AND circuit 130 holds an output signal of the receiving device 100 at a low level (hereinafter referred to as a L-level). At the AND circuit 130, the H-level signal output from the delay circuit 122 is inverted into a L-level signal and input to one input terminal T21. In this case, an output signal of the AND circuit 130 is held at the L-level. Accordingly, the output signal of the receiving device 100 is held at the L-level.

In other words, if the input potential difference becomes less than the standard minimum potential difference and then a predetermined time elapses, the receiving device 100 of this embodiment determines the abnormality in the signal line connected to the differential input terminals T10 and T20. Then, the receiving device 100 of this embodiment holds the output signal at the L-level.

Therefore, for example, if the abnormality in the signal line is detected when the output signal of the receiving device 100 is supplied to a laser driver or the like, operations of the laser driver or the like can be stopped.

Note that in this embodiment, if the input potential difference is greater than or equal to the standard minimum potential difference, the L-level signal is supplied to the input terminal T21 of the AND circuit 130 at all times. An output signal of the LVDS receiver 110 is input to the other input terminal T11 of the AND circuit 130. Since the output signal of the LVDS receiver 110 is determined by the input data Da and the input data Db, the output signal of the receiving device 100 is not susceptible to the abnormality detection circuit 120.

Furthermore, if the H-level signal from the potential difference detection circuit 121 is continuously input for a predetermined time, the delay circuit 122 of this embodiment may output an abnormality notification signal notifying the abnormality in the signal line to an outside. The outside may be, for example, a control unit or the like of a main body apparatus on which the receiving device 100 of this embodiment is mounted. The predetermined time until the abnormality notification signal is output after the H-level signal is input to the delay circuit 122 may be, for example, the delay time set in the delay circuit 122 or may be those separately set in advance.

As described above, according to this embodiment, the abnormality is detected based on the potential difference between the input data Da and the input data Db input to the differential input terminals T10 and T20, respectively, of the LVDS receiver 110. Thus, in this embodiment, even if only one of the differential input terminals T10 and T20 is broken, the abnormality in the signal line can be detected.

Second Embodiment

Figure 4:
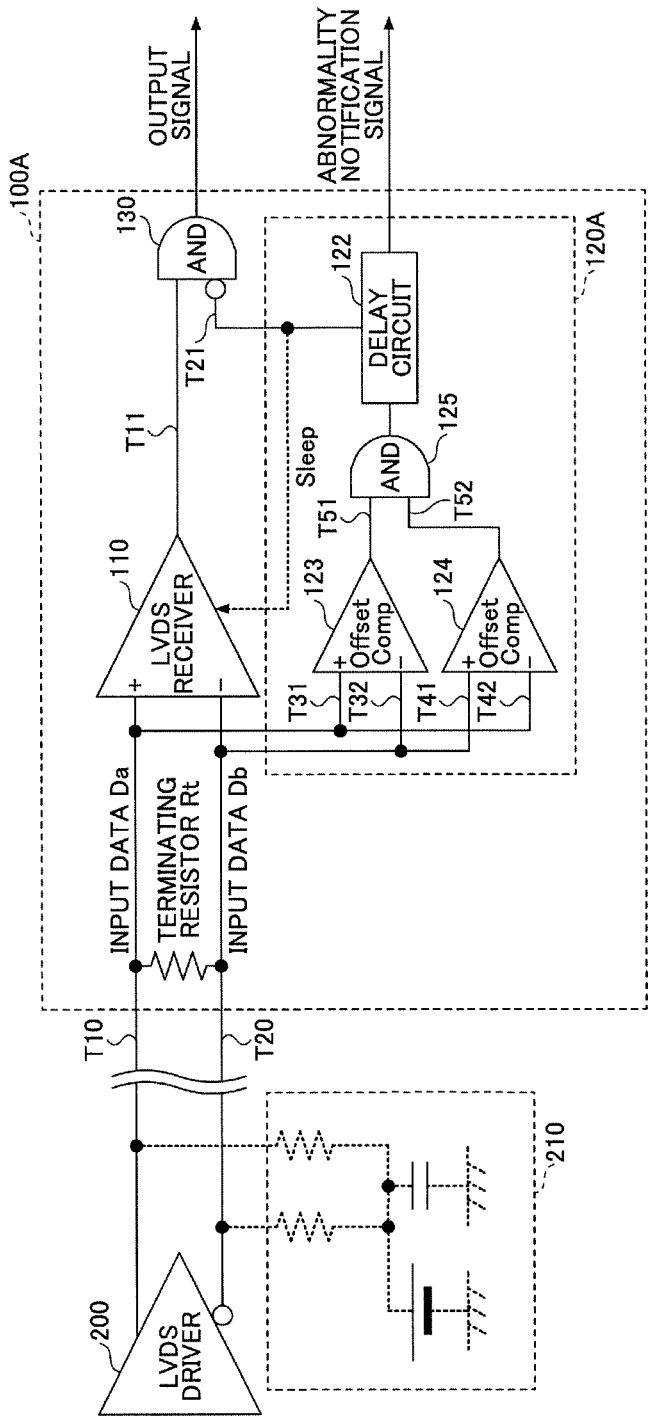
FIG. 4 is a diagram for illustrating a receiving device 100A of a second embodiment.

Referring next to FIG. 4, a second embodiment of the present invention is described below. The second embodiment of the present invention is different from the first embodiment in the configuration of an abnormality detection circuit. Accordingly, a description is made only of a difference between the first and second embodiments. Thus, in this embodiment, components having the same functional configurations as those of the first embodiment are denoted by the same reference numerals and their descriptions are omitted.

FIG. 4 is a diagram for illustrating a receiving device 100A of the second embodiment. An abnormality detection circuit 120A of this embodiment has a delay circuit 122, comparators 123 and 124, and an AND circuit 125.

The comparators 123 and 124 are offset comparators. Assuming that offset voltages of the comparators 123 and 124 are α, each of the comparators 123 and 124 inverts an output signal when a voltage of non-inverting input terminal+α=a voltage of an inverting input terminal.

The comparators 123 and 124 of this embodiment are the comparators having the offset voltage a equal to the value of a standard minimum potential difference.

The comparator 123 has a non-inverting input terminal T31 connected to a non-inverting input terminal T10 of a LVDS receiver 110. Therefore, input data Da are input to the non-inverting input terminal T31 of the comparator 123. In addition, the comparator 123 has an inverting input terminal T32 connected to an inverting input terminal T20 of the LVDS receiver 110. Therefore, input data Db are input to the inverting input terminal T32 of the comparator 123. The comparator 123 has an output connected to one input terminal T51 of the AND circuit 125.

The comparator 124 has a non-inverting input terminal T41 connected to the inverting input terminal T20 of the LVDS receiver 110. Therefore, the input data Db are input to the non-inverting input terminal T41 of the comparator 124. In addition, the comparator 124 has an inverting input terminal T42 connected to the non-inverting input terminal T10 of the LVDS receiver 110. Therefore, the input data Da are input to the inverting input terminal T42 of the comparator 124. The comparator 124 has an output connected to the other input terminal T52 of the AND circuit 125. An output of the AND circuit 125 is supplied to the delay circuit 122.

Furthermore, a reference voltage that the LVDS receiver 110 of this embodiment determines an in-phase input voltage range is generated by a reference voltage source 210 on the side of a LVDS driver 200. The in-phase input voltage range is an input voltage range where the LVDS receiver 110 can normally operate.

Here, operations of the abnormality detection circuit 120A of this embodiment are described.

In this embodiment, each of the comparators 123 and 124 inverts an output when an input potential difference is less than or equal to the offset voltage α. The comparators 123 and 124 of this embodiment are configured to output a L-level signal if the input potential difference is greater than the offset voltage α and output a H-level signal if the input potential difference is less than or equal to the offset voltage α. Accordingly, the comparators 123 and 124 of this embodiment output the H-level signal if the input potential difference becomes less than or equal to the offset voltage α.

Since the H-level signals are input to input terminals T51 and T52 of the AND circuit 125, an output of the AND circuit 125 is held at a H-level. A H-level signal is input to the delay circuit 122. If the H-level signal is continuously input to the delay circuit 122 for a predetermined delay time, the H-level signal is output to an AND circuit 130. At the AND circuit 130, the H-level signal is inverted and then input to an input terminal T21.

According to this embodiment, the H-level signal is output from the AND circuit 125 if the output of the comparator 123 and that of the comparator 124 are at the H-level. Thus, in this embodiment, an abnormality in a signal line is detected if both of the output of the comparator 123 and that of the comparator 124 are at the H-level for a predetermined delay time or more.

Furthermore, if the H-level signal is continuously supplied from the AND circuit 125 for the predetermined delay time or more, the delay circuit 122 of this embodiment may supply a sleep signal to the LVDS receiver 110 to set the LVDS receiver 110 in a standby status. If the LVDS receiver 110 is set in the standby status when the abnormality in the signal line is detected, a consumption current of the LVDS receiver 110 can be reduced. Furthermore, chattering noise due to an in-phase input can be prevented. It is normal that an output of the LVDS receiver becomes digitally indefinite along with the in-phase input. This is because an intermediate potential is ideally output. Even in an in-phase state, however, actual equipment has minute (several mV level) noise continuously caused in an input and an output of the LVDS receiver, and regards a state where a Hi or Lo output is intermittently repeated for each noise as chattering due to the in-phase input.

Note that in this embodiment, a signal as a logical product of the output signal of the comparator 123 and that of the comparator 124, which is generated by the AND circuit 125, is configured to be input to the delay circuit 122. However, the configuration of the receiving device 100A is not limited to this. For example, in this embodiment, the comparators 123 and 124 may be switched to each other so that a signal as a logical sum or a signal as an XOR of the output signal of the comparator 123 and that of the comparator 124 is input to the delay circuit 122.

Third Embodiment

Next, a third embodiment of the present invention is described below. The third embodiment of the present invention is different from the first embodiment in the configuration of an abnormality detection circuit. Accordingly, a description is made only of a difference between the first and third embodiments. Thus, in this embodiment, components having the same functional configurations as those of the first embodiment are denoted by the same reference numerals and their descriptions are omitted.

Figure 5:
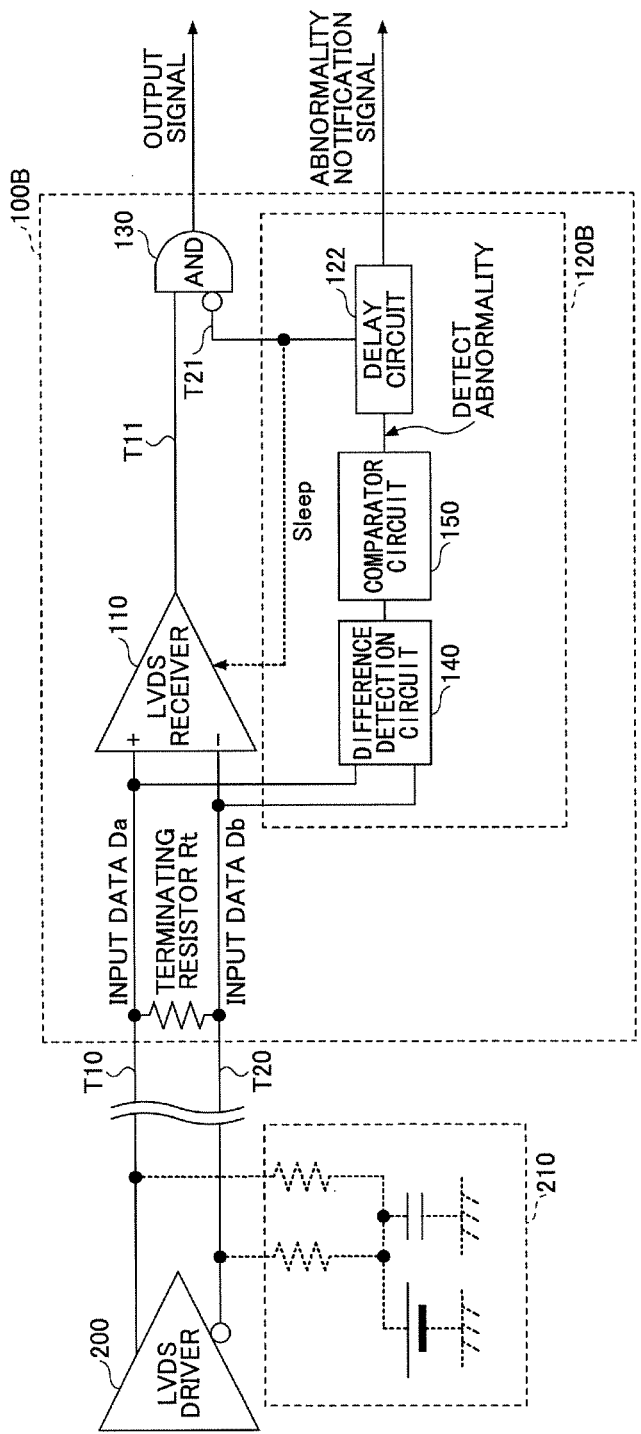
FIG. 5 is a diagram for illustrating a receiving device 100B of a third embodiment.

FIG. 5 is a diagram for illustrating a receiving device 100B of the third embodiment. In the receiving device 100B of this embodiment, an abnormality detection circuit 120B has a difference detection circuit 140, a comparator circuit 150, and a delay circuit 122.

The difference detection circuit 140 of this embodiment is supplied with input data Da and input data Db and detects an input potential difference between them. The comparator circuit 150 compares the input potential difference detected by the difference detection circuit 140 with an offset voltage $\alpha 1$ described below.

The receiving device 100B of this embodiment detects an abnormality in a signal line if the input potential difference is less than or equal to the offset voltage $\alpha 1$. In other words, the comparator circuit 150 outputs a H-level signal to the delay circuit 122. The delay circuit 122 outputs the H-level signal if the H-level signal is continuously supplied from the comparator circuit 150 for a predetermined delay time or more. The H-level signal output from the delay circuit 122 is inverted and input to an input terminal T21 of an AND circuit 130.

Figure 6:
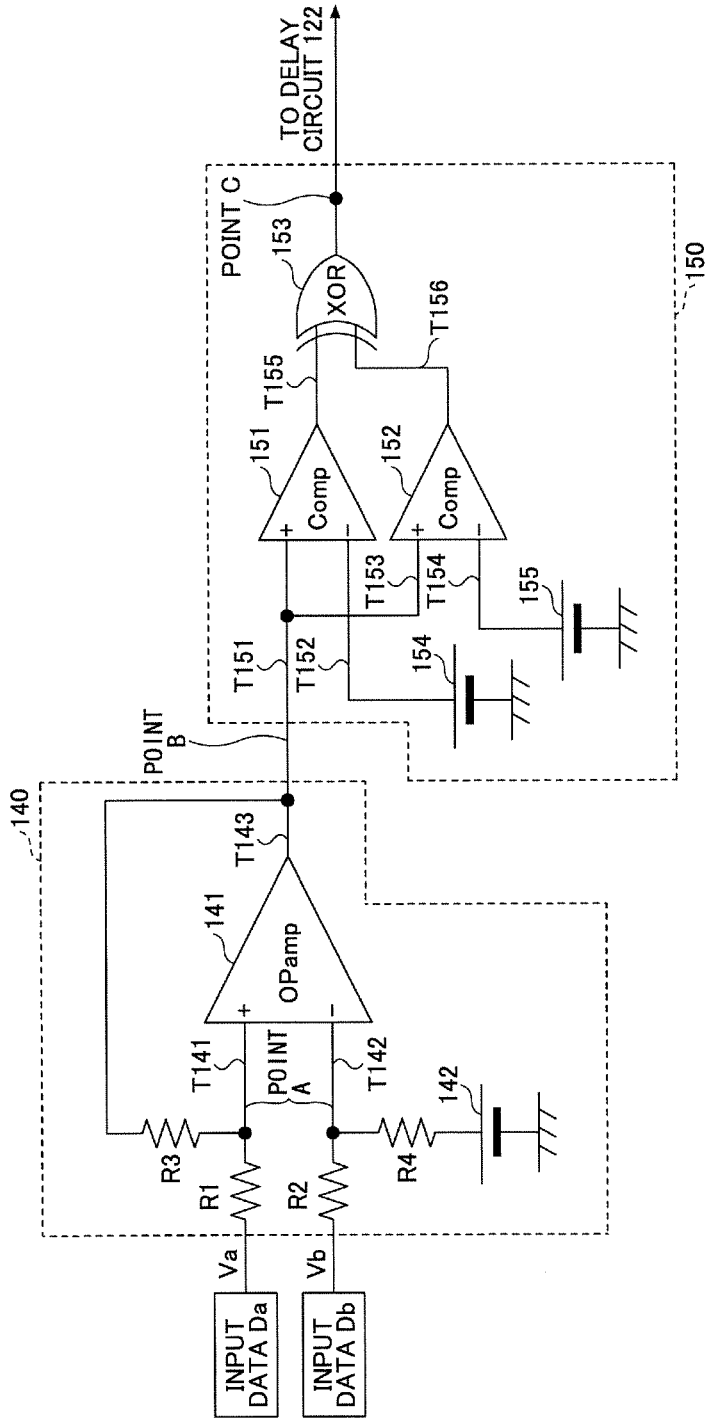
FIG. 6 is a diagram for illustrating a difference detection circuit 140 and a comparator circuit 150.

Referring next to FIG. 6, the difference detection circuit 140 and the comparator circuit 150 of this embodiment are described below. FIG. 6 is a diagram for illustrating the difference detection circuit 140 and the comparator circuit 150.

The difference detection circuit 140 of this embodiment is composed of an amplifier 141, resistors R1 through R4, and a reference voltage source 142 that generates a reference voltage VREF.

The amplifier 141 has a non-inverting input terminal T141 connected to a differential input terminal T10 of a LVDS receiver 110 via the resistor R1. Therefore, the input data Da are input to the non-inverting input terminal T141 of the amplifier 141. In addition, the amplifier 141 has the non-inverting input terminal T141 connected to an output terminal T143 of the amplifier 141.

The amplifier 141 has an inverting input terminal T142 connected to a differential input terminal T20 of the LVDS receiver 110. Therefore, the input data Db are input to the inverting input terminal T142 of the amplifier 141. In addition, the amplifier 141 has the inverting input terminal T142 grounded via the resistor R4 and the reference voltage source 142.

The comparator circuit 150 of this embodiment has comparators 151 and 152, an XOR circuit 153, and reference voltage sources 154 and 155.

The non-inverting input terminal T151 of the comparator 151 and the non-inverting input terminal T153 of the comparator 152 are connected to the output terminal T143 of the amplifier 141. The comparator 151 has an inverting input terminal T152 grounded via the reference voltage source 154. The comparator 152 has an inverting input terminal T154 grounded via the reference voltage source 155.

The comparator 151 has an output connected to an input terminal T155 of the XOR circuit 153. The comparator 152 has an output connected to an input terminal T156 of the XOR circuit 153. An output of the XOR circuit 153 is supplied to the delay circuit 122.

The comparators 151 and 152 of this embodiment are comparators having the same offset voltage. In this embodiment, the offset voltages of the comparators 151 and 152 are assumed to be $\alpha 1$.

The reference voltage source 154 generates a voltage obtained by adding the offset voltage $\alpha 1$ of the comparator 151 to the predetermined reference voltage VREF. The reference voltage source 155 generates a voltage obtained by subtracting the offset voltage $\alpha 1$ of the comparator 152 from the predetermined reference voltage VREF.

Assuming that a voltage of the input data Da is a voltage Va and that of the input data Db is a voltage Vb in this embodiment, the difference detection circuit 140 subtracts the voltage Vb from the voltage Va. If a result (Va−Vb) obtained by subtracting the voltage Vb from the voltage Va shows a negative value, the subtracted result becomes 0 V unless a negative power supply is provided. Therefore, in this embodiment, the reference voltage source 154 of the comparator circuit 150 adds the reference voltage VREF to the offset voltage $\alpha 1$. In addition, the reference voltage source 155 of the comparator circuit 150 subtracts the offset voltage $\alpha 1$ from the reference voltage VREF.

In the difference detection circuit 140 of this embodiment, a voltage of the non-inverting input terminal T141 and that of the inverting input terminal T142 of the amplifier 141 (the voltages at a point A) are found by the formula (VREF+Vb)/2. Furthermore, a voltage of the output terminal T143 of the amplifier 141 (the voltage at a point B) is found by the formula [Va−{Va−(VREF+Vb)/2}×2=Vb−Va+VREF].

Here, a description is made of a case where an output of the comparator circuit 150 switches to a H-level.

In order to obtain the H-level output from the comparator circuit 150, it is required that an output of the XOR circuit 153 be set to the H-level. Accordingly, it is required that one of an output of the comparator 151 and that of the comparator 152 switches to the H-level.

In this embodiment, if the condition (VREF−$\alpha 1 \leq$Vb−Va+VREF$\leq$VREF+$\alpha 1$) is met, one of the output of the comparator 151 and that of the comparator 152 switches to the H-level. The above condition can be expressed as (−$\alpha 1 \leq$Vb−Va$\leq \alpha 1$). This condition can further be expressed as (Vb−Va)$\leq |\alpha 1|$.

Accordingly, in this embodiment, an abnormality in a signal line is detected if the input potential difference is less than or equal to the offset voltages $\alpha 1$ of the comparators 151 and 152.

Note that resistance values of the resistors R1 through R4 of this embodiment are preferably substantially greater than a resistance value of a terminating resistor Rt so as not to affect operations of the LVDS receiver 110.

Fourth Embodiment

Figure 7:
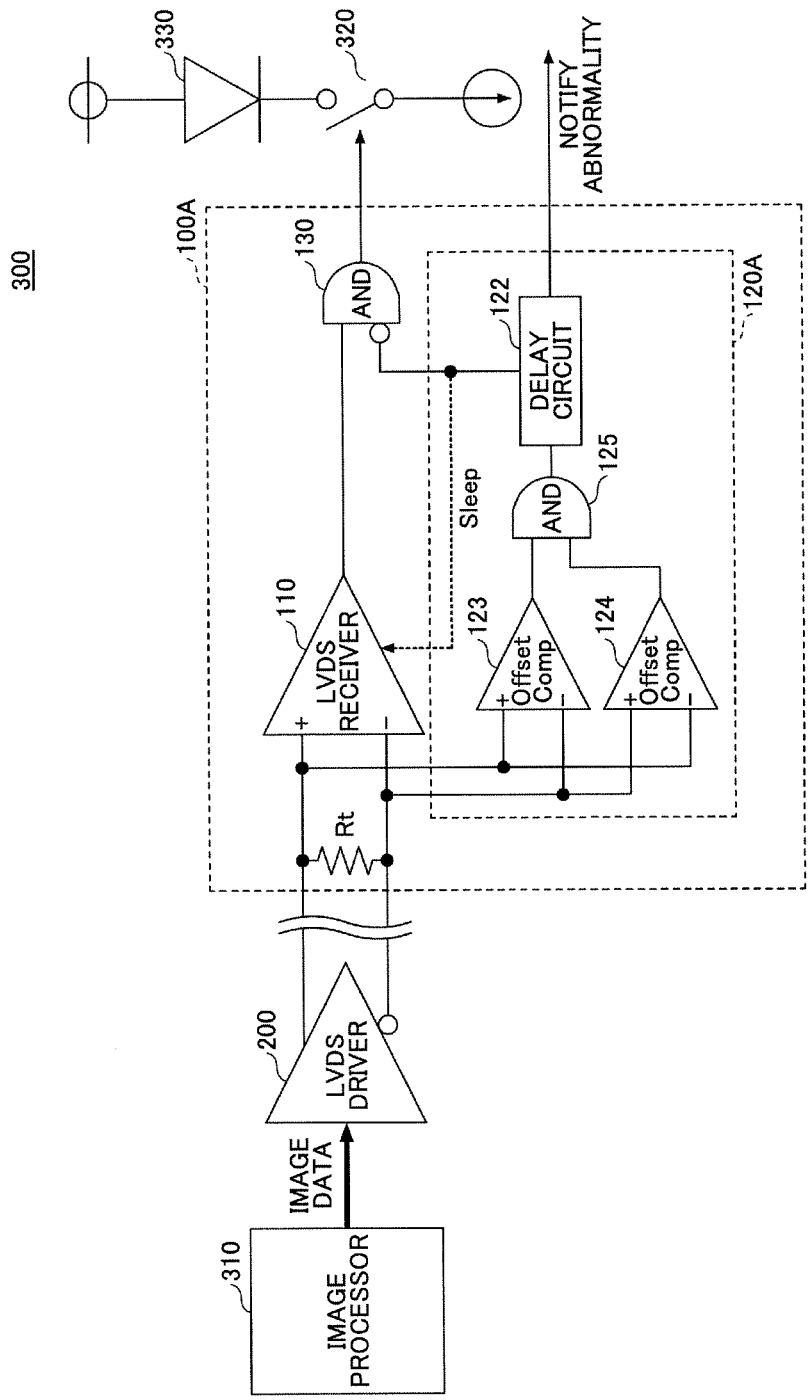
FIG. 7 is a diagram for illustrating a driving unit 300 of a fourth embodiment.

Referring next to FIG. 7, a fourth embodiment of the present invention is described below. The fourth embodiment of the present invention refers to a driving circuit having a LVDS receiver. Here, a description is made of an example of a driving unit having the receiving device 100A of the second embodiment. Note that in this embodiment, components having the same functional configurations as those of the second embodiment are denoted by the same reference numerals and their descriptions are omitted.

FIG. 7 is a diagram for illustrating a driving unit 300 of the fourth embodiment.

The driving unit 300 of this embodiment has the receiving device 100A, a LVDS driver 200, an image processor 310, and a switching unit 320. In the driving unit 300, a LD (Laser Diode) 330 as a load of the driving unit 300 is connected to the switching unit 320.

In the driving unit 300 of this embodiment, the LVDS driver 200 transmits image data output from the image processor 310 to the receiving device 100A. The receiving device 100A turns on/off the switching unit 320 in accordance with the transmitted image data. Based on an output signal from the receiving device 100A, the switching unit 320 is turned on/off. The switching unit 320 of this embodiment is turned on with a H-level signal and turned off with a L-level signal.

In the driving unit 300 of this embodiment, if an abnormality is detected in a signal line between the LVDS driver 200 and the receiving device 100A, the output signal of the receiving device 100A is held at a L-level. Accordingly, in this embodiment, if the abnormality is detected in the signal line, the switching unit 320 is turned off to extinguish the LD 330.

As described above, in the driving unit 300 of this embodiment in which the LVDS driver 200 transmits data to the receiving device 100A under a LVDS method, the abnormality in the signal line between the LVDS driver 200 and the receiving device 100A is detected. If the abnormality in the signal line is detected, the driving of the load connected to the driving unit 300 is stopped.

Note that the receiving device 100A is applied to the driving unit 300 in this embodiment, but the receiving device 100 described in the first embodiment and the receiving device 100B described in the third embodiment may also be applied to the driving unit 200 of this embodiment.

Fifth Embodiment

Next, a fifth embodiment of the present invention is described. The fifth embodiment of the present invention refers to an image forming apparatus on which the driving unit 300 of the fourth embodiment is mounted.

Figure 8:
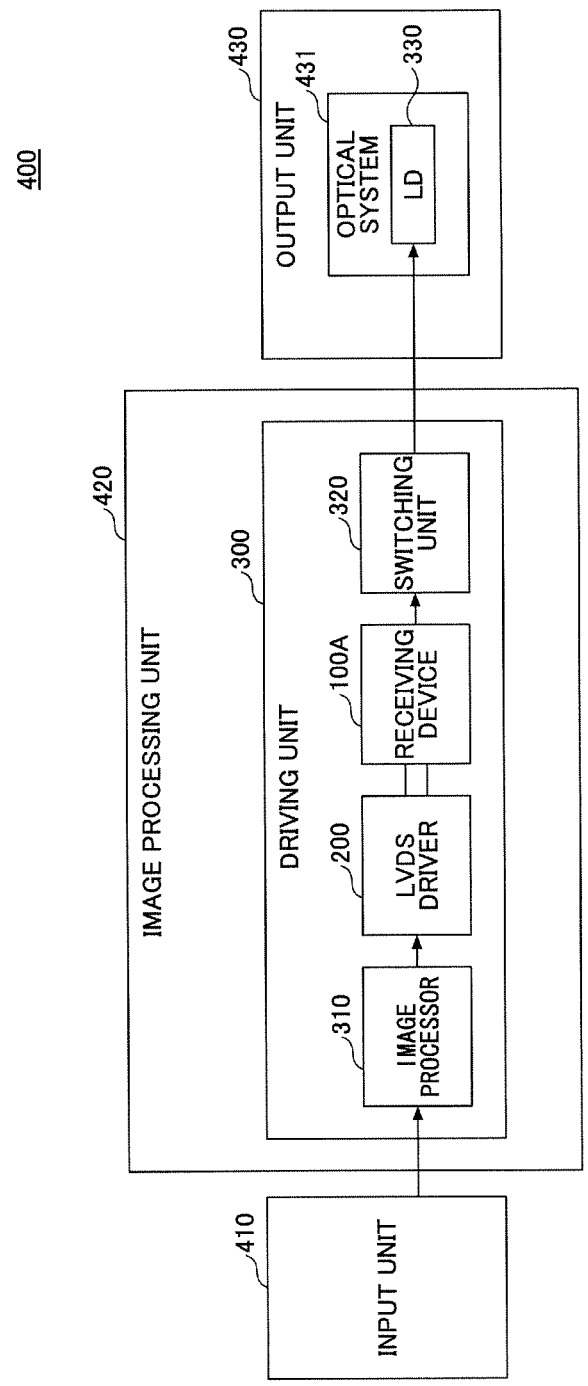
FIG. 8 is a diagram for illustrating an image forming apparatus 400 of a fifth embodiment.

FIG. 8 is a diagram for illustrating an image forming apparatus 400 of the fifth embodiment.

The image forming apparatus 400 of this embodiment performs image formation using the laser beam of a LD. The image forming apparatus 400 has an input unit 410, an image processing unit 420, and an output unit 430. The input unit 410 may be, for example, an image reading unit such as a scanner. Alternatively, the input unit 410 may be an interface unit for acquiring image data from an information processing apparatus to which the image forming apparatus 400 is connected via a network.

The image processing unit 410 processes image data input from the input unit 410 into those capable of being output from the output unit 430. Furthermore, the image processing unit 410 has the driving unit 300 described in the fourth embodiment. In the image processing unit 410, image data are input to the image processor 310 of the driving unit 300 for image processing. The image data after being subjected to the image processing are transmitted by the LVDS driver 200 and the receiving device 100A under the LVDS method and then output to the output unit 430.

The output unit 430 includes an optical system 431 for performing image formation on recording media such as print sheets. Besides the optical system 431, the output unit 430 also includes various configurations necessary for performing image formation. For example, the output unit 430 applies the laser beam of a LD 330 included in the optical system 431 to an image forming area of a previously-discharged photosensitive body to remove electricity from the image forming area of the front surface of the photosensitive body. Moreover, the output unit 430 causes toner to be adsorbed onto the photosensitive body and then causes the toner adsorbed on the area where the electricity is removed by the laser beam to be thermally fixed to perform image formation.

With the provision of the driving unit 300, the image forming apparatus 400 of this embodiment can stop the application of the laser beam from the LD 330 if an abnormality is detected in a signal line as a transmission path for image data.

The present invention is not limited to the specifically disclosed embodiments, and variations and modifications may be made without departing from the scope of the present invention.

The present application is based on Japanese Priority Application No. 2009-060256 filed on Mar. 12, 2009, the entire contents of which are hereby incorporated herein by reference.

What is claimed is:

1. A driving unit that drives a load based a small-amplitude differential signal transmitted from a low voltage differential signal (LVDS) driver, the driving unit comprising:
   a differential input circuit having an inverting input terminal and a non-inverting input terminal to which the differential signal is input;
   an abnormality detection circuit that detects an abnormality in a wiring connected to the inverting input terminal and the non-inverting input terminal; and
   a control circuit that sets an output signal of the driving unit in a predetermined status to stop a driving of the load when the abnormality detection circuit detects the abnormality in the wiring connected to the inverting input terminal and the non-inverting input terminal; wherein
   the abnormality detection circuit detects the abnormality in the wiring connected to the inverting input terminal and the non-inverting input terminal if a status, in which a potential difference between a voltage of the inverting input terminal and a voltage of the non-inverting input terminal is less than a predetermined minimum potential difference value, continues for a predetermined time or more, and wherein
   the control circuit includes an AND circuit that outputs the output signal of the driving unit and receives as inputs an output of the differential input circuit and an output of the abnormality detection circuit, and wherein
   in a case that the output of the abnormality detection circuit indicates that the abnormality has been detected, the AND circuit holds the output signal of the driving unit in the predetermined status to stop driving of the load, and
   in a case that the output of the abnormality detection circuit does not indicate that the abnormality has been detected, the output of the differential input circuit is passed through as the output signal of the driving unit.

2. An image forming apparatus that irradiates a charged front surface of a photosensitive body with a laser beam of a laser diode to form an electrostatic latent image and fixes toner attached to the electrostatic latent image onto a recording medium to perform image formation, the image forming apparatus comprising:

the driving unit according to claim 1 to control light emission of the laser diode.

3. The driving unit according to claim 1, wherein
the abnormality detection circuit comprises
a potential difference detection circuit that outputs a predetermined signal if the potential difference between the voltage of the inverting input terminal and the voltage of the non-inverting input terminal of the differential input circuit becomes less than the minimum potential difference, and
a delay circuit that delays the predetermined signal output from the potential difference detection circuit for the predetermined time.

4. The driving unit according to claim 3, wherein
the predetermined time delayed by the delay circuit is a time in which a total time of the predetermined time and a detection time by the abnormality detection circuit becomes twice or more as large as a minimum operating rate of the differential input circuit.

5. The driving unit according to claim 1, wherein
the abnormality detection circuit comprises
first and second comparators that invert an output signal if the potential difference between the voltage of the inverting input terminal and the voltage of the non-inverting input terminal of the differential input circuit is less than or equal to the minimum potential difference, and
a delay circuit that delays a signal generated by the output signal of the first comparator and the output signal of the second comparator for the predetermined time,
the differential input circuit has
the inverting input terminal connected to an inverting input terminal of the first comparator and an non-inverting input terminal of the second comparator, and
the non-inverting input terminal connected to a non-inverting input terminal of the first comparator and an inverting input terminal of the second comparator, and
the abnormality detection circuit detects the abnormality if levels of the output signal of the first comparator and the output signal of the second comparator are continuously held for the predetermined time or more.

6. The driving unit according to claim 1, wherein
the abnormality detection circuit comprises
a potential difference detection circuit that detects the potential difference between the voltage of the inverting input terminal and the voltage of the non-inverting input terminal of the differential input circuit,
a comparator circuit that compares the potential difference with a predetermined voltage, and
a delay circuit that delays an output signal of the comparator circuit for the predetermined time, and
the predetermined voltage is a value less than or equal to the minimum potential difference.

7. The driving unit according to claim 1, wherein
the abnormality detection circuit outputs an abnormality notification signal notifying a detection of the abnormality at a time of detecting the abnormality.

8. The driving unit according to claim 1, wherein
the abnormality detection circuit sets the differential input circuit in a standby status at a time of detecting the abnormality.

9. The driving unit according to claim 1, wherein
in a case that the abnormality detection circuit detects the abnormality, the abnormality detection circuit outputs an internal abnormality detected signal and additionally outputs an abnormality detected notification signal to outside of the detecting device, in addition to the output signal of the driving unit set by the control circuit to the predetermined status to stop driving of the load when the abnormality is detected.

10. The driving unit according to claim 1, further comprising:
a terminating resistor connected between the inverting input terminal and the non-inverting input terminal of the differential input circuit.

11. The driving unit according to claim 1, further comprising:
a reference voltage source that generates a reference voltage and said reference voltage is employed by the driving unit to determine an in-phase input voltage range in which the driving unit operates.

12. The driving unit according to claim 1, wherein the predetermined time is twice or more of a minimum operating transfer rate of the driving unit.

* * * * *